United States Patent
Kuo et al.

(10) Patent No.: US 9,640,450 B1
(45) Date of Patent: May 2, 2017

(54) METHOD FOR REDUCING LIGHT-INDUCED-DEGRADATION IN MANUFACTURING SOLAR CELL

(71) Applicant: MOTECH INDUSTRIES INC., New Taipei (TW)

(72) Inventors: Kuang-Yang Kuo, Tainan (TW); Wei-Lun Lu, Tainan (TW); Huang-Yu Chen, Tainan (TW); Chien-Chun Wang, Tainan (TW); Yu-Pan Pai, Tainan (TW)

(73) Assignee: MOTECH INDUSTRIES INC., New Taipei (TW)

( * ) Notice: Subject to any disclaimer, the term of this patent is extended or adjusted under 35 U.S.C. 154(b) by 0 days.

(21) Appl. No.: 14/921,329

(22) Filed: Oct. 23, 2015

(51) Int. Cl.
*H01L 21/66* (2006.01)
*H01L 31/18* (2006.01)

(52) U.S. Cl.
CPC .............. *H01L 22/26* (2013.01); *H01L 22/12* (2013.01); *H01L 31/1804* (2013.01); *H01L 31/1864* (2013.01)

(58) Field of Classification Search
CPC ....... G01R 31/308; G01R 31/26; H02S 50/10; H01L 31/0445; H01L 31/0475; H01L 31/18; H01L 22/26; H01L 22/12
USPC ...................................................... 250/341.1
See application file for complete search history.

(56) References Cited

U.S. PATENT DOCUMENTS

2002/0030153 A1* 3/2002 Matsuyama ............ H02S 50/10
250/214.1
2015/0333193 A1* 11/2015 Appel ..................... C30B 15/04
136/256

FOREIGN PATENT DOCUMENTS

CN 102437232 A 5/2012
CN 102839415 A 12/2012

* cited by examiner

*Primary Examiner* — Caridad Everhart
(74) *Attorney, Agent, or Firm* — Hauptman Ham, LLP

(57) ABSTRACT

A method for reducing light-induced-degradation in manufacturing a solar cell, includes the steps of: (a) irradiating the solar cell with an irradiance; (b) maintaining the solar cell within a temperature range; (c) removing the solar cell away from the irradiance of step (a) after a time; and (d) determining the irradiance, the temperature range, and the time such that the LID is optimally below a predetermined LID.

16 Claims, 4 Drawing Sheets

METHOD FOR REDUCING LIGHT-INDUCED-DEGRADATION IN MANUFACTURING SOLAR CELL

BACKGROUND

1. Field of the Disclosure

The present disclosure generally relates to the manufacture of solar cells, and more particularly to a method for reducing light-induced-degradation during the manufacturing process.

2. Description of the Related Art

Presently, solar energy is an increasingly popular energy source for promoting green energy worldwide. There has been, however, a constant problem of low light-to-electricity conversion efficiency. The efficiency of the solar cell may decrease with time, particularly under a long duration of illumination; this is called the "light-induced-degradation (LID)" effect.

Conventional methods for ameliorating the LID effect includes reducing the interstitial oxygen atoms arising in the mono-crystalline and poly-crystalline wafer during the crystal growth process by improving the quality of the silicon. Altering the dopant concentration and/or applying an external magnetic field during silicon-growing also will help. Another method is to reduce the boron atoms dopant, for example, utilizing gallium or indium instead of boron as the dopant. Still another way is to employ an n-type wafer for the solar cell with a phosphorus dopant instead of a p-type wafer with a boron dopant. These methods may ameliorate the LID effect, but will also substantially increase solar cell manufacturing costs.

Chinese Patent Publication No. CN102839415 discloses a method for solving the LID effect by applying an external magnetic field during the wafer silicon-growing step, or alternatively by using gallium instead of boron as the wafer dopant. Chinese Patent Publication No. CN102437232, also discloses a gallium dopant, and alternatively a phosphorus dopant that can reduce the LID effect.

Accordingly, there exists a need to provide a solution to solve the aforesaid problems.

SUMMARY

The present disclosure provides a method for determining the process parameters for optimal modulation of the light-induced-degradation (LID) effect by irradiating and heating the solar cell such that the LID effect will be constrained below a predetermined LID. The method comprises the steps of: (a) irradiating the solar cell with an irradiance; (b) maintaining the solar cell within a temperature range; (c) removing the solar cell away from the irradiance of step (a) after a time; and (d) determining the irradiance, the temperature range, and the time such that the LID is optimally below a predetermined LID.

The foregoing, as well as additional objects, features and advantages of the disclosure will be more readily apparent from the following detailed description, which proceeds with reference to the accompanying drawings.

DETAILED DESCRIPTION OF THE EMBODIMENT

A typical silicon solar cell is doped with boron and phosphorus dopants. However, the boron dopant will combine with oxygen to produce boron-oxygen bonding complexes. These complexes are formed from the trapping of an ambient oxygen electron into an interstitial hole formed from the boron doping, thereby forming a recombination center which decreases the minority carrier lifetime and their diffusion length. Accordingly, the efficiency of the solar cell is decreased and the overall output power of a solar module composed of the solar cells is also reduced. This phenomenon is called the light-induced degradation (LID). Particularly in a typical boron-doped solar cell, this LID is in the range of 3~10%, a significant degradation of solar cell efficiency.

Presently, a LID below 3% is acceptable, but as new technologies improve the conversion efficiency of solar cells, if the LID does not concomitantly decrease, its relative effect will be more pronounced.

The present disclosure provides a method for reducing light-induced-degradation in manufacturing a solar cell by irradiating and heating the solar cell for a time such that the boron-oxygen bonding complexes will decrease and the efficiency of the solar cell will be improved by the amelioration of the LID effect.

Figure 1:
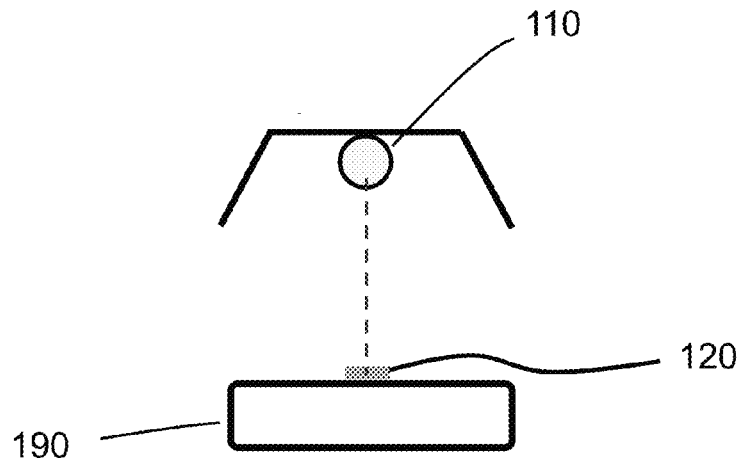
FIG. 1 shows that the irradiance is determined by a spectrometer which is placed directly below the light source.
Figure 2:
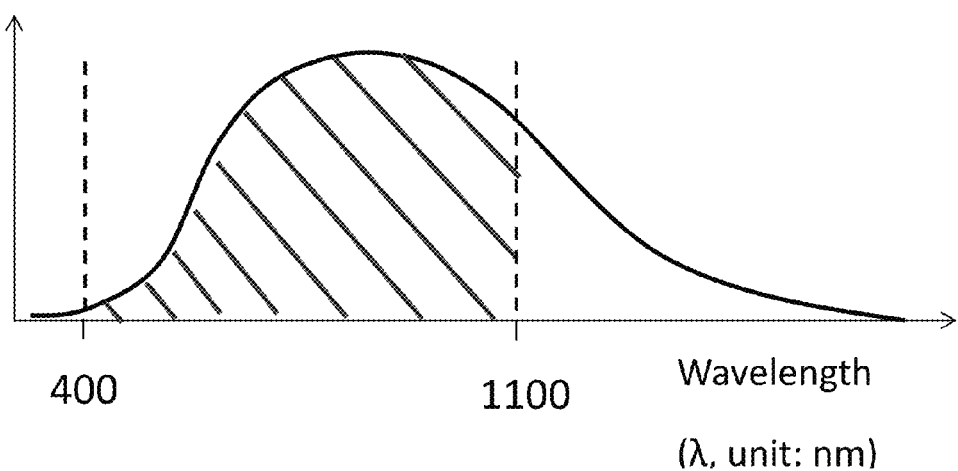
FIG. 2 shows the irradiance spectrum which is measured by the spectrometer.

Referring to FIG. 1, a light source 110, typically a light-emitting diode, high-intensity discharge lamp, or a halogen lamp, irradiates and heats the solar cell. Typically the irradiance of the light source is at least equal to the sunlight of "one sun" which is defined as AM 1.5 G=1 kW/m$^2$. The irradiance can be determined by a spectrometer 120 which is placed at the solar cell 190 and directly below the light source 110, thereby obtaining an irradiance spectrum as shown in FIG. 2. When the irradiating light has a wavelength region ranged from 400 to 1000 nm (visible and near-infrared light), the light can be effectively absorbed by the solar cell 190. Therefore, the irradiance can be predetermined as within the 400~4000 nm wavelength range that is at least one sun. In addition, the irradiance can be generated by two or more light sources, and the irradiance will be an average irradiance of the light sources.

Figure 3:
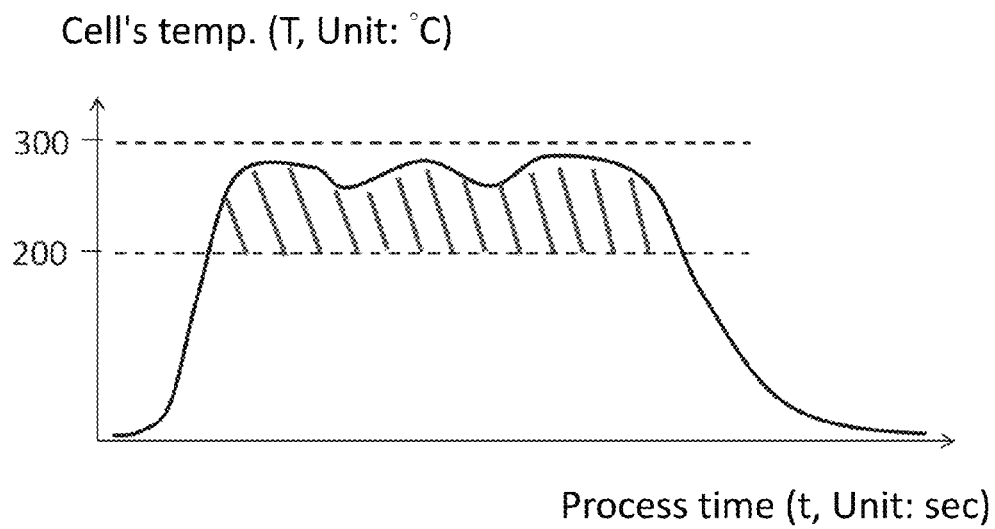
FIG. 3 shows the temperature curve that is measured by a thermocouple.

Referring again to FIG. 1, the solar cell 190 can be heated by the light source 110, and the temperature may also be determined by disposing a thermocouple on the solar cell. The temperature obtained by the thermocouple is shown as temperature curve shown in FIG. 3. According to the experiments of the present disclosure, the temperature of the solar cell 190 is maintained within a range of 200~300 degrees Celsius (° C.). This may reduce the LID effect significantly.

Furthermore, from the experiments of the present disclosure, when the irradiance is more than 1 kW/m$^2$ and does not exceed 8 kW/m$^2$, the temperature is between 200 and 300° C., and the time will be determined to be within 10 and 600 seconds. From these experimental results, the parameters of irradiance, temperature, and process time may be determined for an LID that falls within the optimum values for solar cell manufacturing.

The present disclosure provides a method for determining the process parameters for optimal modulation of the LID effect by irradiating and heating the solar cell such that the LID effect will be constrained below a predetermined LID. In one embodiment of the present disclosure, the method of present disclosure comprises the steps of: (a) irradiating the solar cell with an irradiance; (b) maintaining the solar cell within a temperature range; (c) removing the solar cell away from the irradiance of step (a) after a time; and (d) determining the irradiance, the temperature range, and the time such that the LID is optimally below a predetermined LID. By repeating this method, many sets of the process parameters may be obtained, such that the LID is below a LID optimum value, consistent with industry standards.

In other embodiments of the present disclosure, the irradiance is in the wavelength region of 400~1100 nm, the irradiance is more than 1 kW/m² and does not exceed 8 kW/m², the temperature range is between 200 and 300° C., the time is within 10 and 600 seconds, and the predetermined LID is 1.5%, respectively.

From the experiments of the present disclosure, an equation can be derived based on the parameters described above. That is, and "LID budget" can be determined by the equation below, $$\text{LID budget} = \int_{t1}^{t} \int_{400}^{1100} I(\lambda) T(t') d\lambda dt'$$

This equation is first the integral over wavelength of the irradiance as a function of wavelength times the temperature as a function of time, and an indefinite integral over time, where the time is a process time determined by the experiments of the present disclosure.

In one embodiment of the present disclosure, the integral over wavelength of the irradiance $I(\lambda)$ is in the range of 400~4100 nm, wherein light of this wavelength range could be effectively absorbed by the silicon substrate in order to promote the generation of electron-hole pairs necessary for the production of an electric field for the generation of the desired current. According to the experiments of the present disclosure, the integral of the irradiance $I(\lambda)$ within 400~1100 nm is more than kW/m² and does not exceed 8 kW/m².

The $t_1$ time limit of integration is determined when the irradiance or other sources of heating (for example a resistance heater) causes the temperature of the solar cell to rise to the threshold value of 200° C. The t is a variable limit determined experimentally when the LID has reached a predetermined LID (for example, a very desirable 1.5%) upon the irradiance of different predetermined radiation power, thereby decreasing the LID effect, and causing the temperature to cool down to the lower threshold value of 200° C., and the value of t is thereby determined as the process time. In addition, for mass production, the time within 10-600 seconds is the most effective. Therefore, based on the LID budget and the parameters determined by the experiments of the present disclosure the method produces the chart as shown in FIG. 4.

Figure 4:
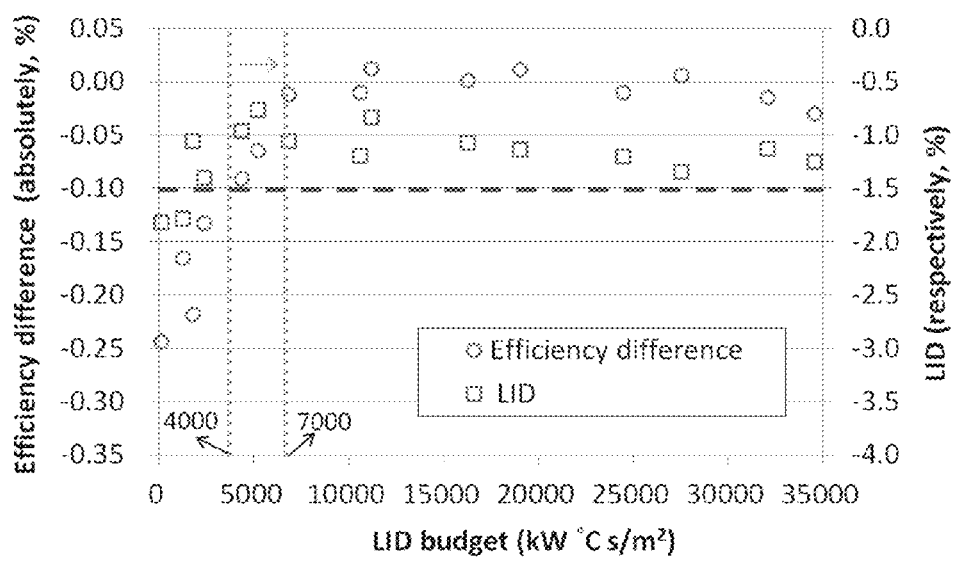
FIG. 4 shows a diagram of the LID budget and the irradiance, temperature, and time parameters.

Referring to FIG. 4, the x-axis is the LID budget. The left y-axis is an efficiency difference before and after the irradiating-heating process. The right y-axis is an LID (called the "LID test"), which is the industry standard method for rapidly simulating an actual LID effect. The "LID test" involves placing the solar cell into a simulation of one sun irradiance and 50±10° C. with a 60 hour time period. According to FIG. 4, the LID falls below 1.5% when the LID budget is within $4.0 \times 10^3$ and $3.5 \times 10^4$ kW ° C. sec/m², and the efficiency difference is under 0.1%. For obtaining the optimal efficiency, the LID budget is narrowed within $7.0 \times 10^3$ and $3.5 \times 10^4$ kW ° C. sec/m², such that the efficiency difference will be under 0.05% and the LID still constrained to below 1.5%.

Figure 5:
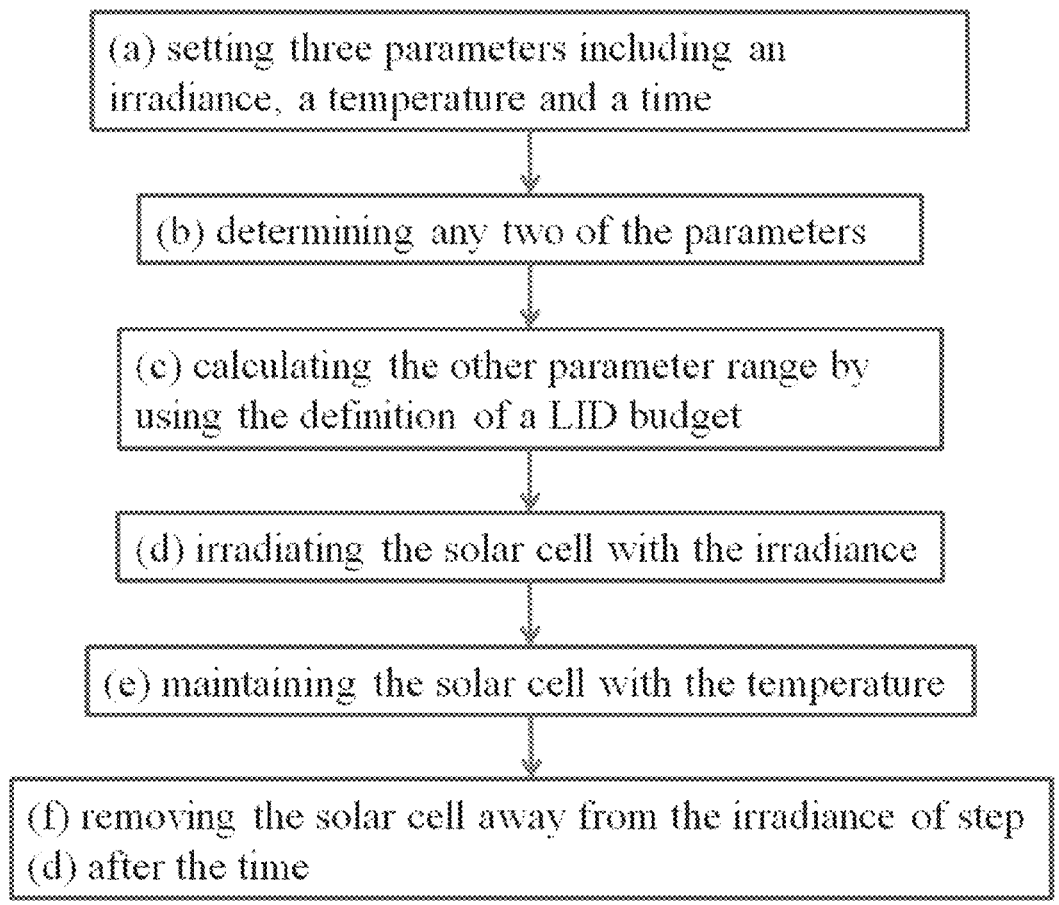
FIG. 5 shows the flow chart of the method of the present disclosure for reducing light-induced-degradation in manufacturing a solar cell.

Referring to FIG. 5, the present disclosure provides a method for utilizing three parameters, including irradiance, temperature, and time, and from any two of the parameters, the other parameter can be calculated using the definition of the LID budget given above. In one embodiment of the present disclosure, the method comprising the steps of: (a) setting three parameters, including an irradiance, a temperature and a time; (b) determining any two of the parameters; (c) calculating the other parameter range by using the definition of the LID budget; (d) irradiating the solar cell with the irradiance; (e) maintaining the solar cell with the temperature; and (f) removing the solar cell away from the irradiance of step (d) after the time.

In other embodiments of the present disclosure, the temperature of the solar cell is maintained by being irradiated in the step (d), the temperature of the solar cell is maintained by an external heating means, the temperature of the solar cell decreases to the room temperature after step (0, the irradiance is generated by two light sources, the irradiance is an average irradiance of light sources, the definition of the LID budget as below:

$$\text{LID budget} = \int_{t1}^{t} \int_{400}^{1100} I(\lambda) T(T) d\lambda d'$$

where the LID budget is within $4.0 \times 10^3$ and $3.5 \times 10^4$ kW° C. sec/m², and the LID budget is within $7.0 \times 10^3$ and $3.5 \times 10^4$ kW ° C. sec/m².

Figure 6:
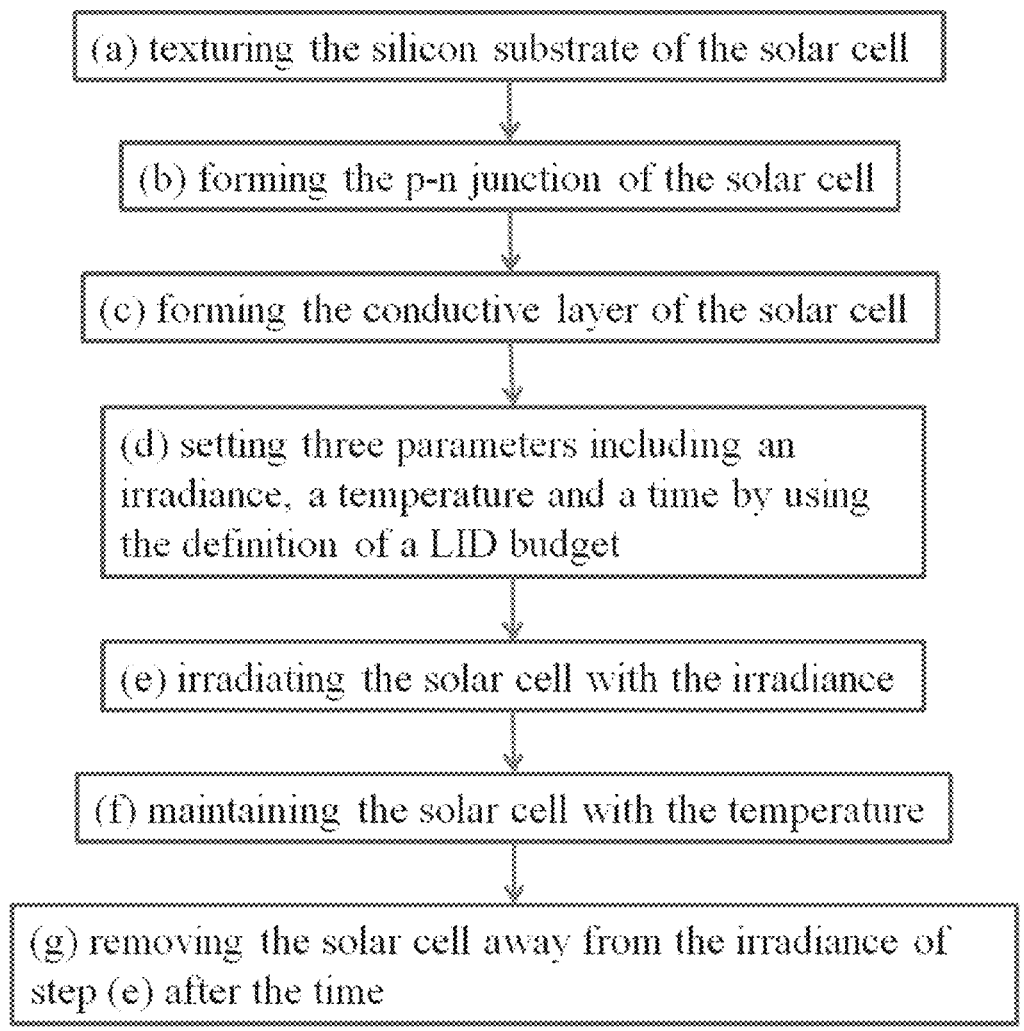
FIG. 6 shows the flow chart of the process of manufacturing a solar cell according to the present disclosure.

Referring to FIG. 6, the present disclosure is shown as a process of manufacturing a solar cell. In one embodiment of the present disclosure, the method comprise the steps of: (a) texturing the silicon substrate of the solar cell; (b) forming the p-n junction of the solar cell; (c) forming the conductive layer of the solar cell; (d) setting three parameters including an irradiance, a temperature and a time by using the definition of the LID budget; (e) irradiating the solar cell with the irradiance; (f) maintaining the solar cell with the temperature; and (g) removing the solar cell away from the irradiance of step (e) after the time.

From this process, the LID effect can be improved by the above mentioned embodiment. Furthermore, the LID can be constrained below 1.5% and the efficiency difference is under 0.1%.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

What is claimed is:

1. A method for constraining light-induced-degradation (LID) on a solar cell, the method comprising the steps of:
   (a) irradiating the solar cell with an irradiance;
   (b) maintaining the solar cell within a temperature range from 200 to 300° C.;
   (c) removing the solar cell away from the irradiance of step (a) after a time; and
   (d) determining the irradiance, the temperature range and the time such that the LID is optimally below a predetermined LID.

2. The method of claim 1, wherein the irradiance is in a wavelength region from 400 to 1100 nm.

3. The method of claim 1, wherein the irradiance is more than 1 kW/m$^2$ and does not exceed 8 kW/m$^2$.

4. The method of claim 1, wherein the time is within 10 and 600 sec.

5. The method of claim 1, wherein the predetermined LID is 1.5%.

6. A method for reducing light-induced-degradation (LID) in manufacturing a solar cell, the method comprising the steps of:
  (a) determining any two of three parameters including an irradiance, a temperature and a time;
  (b) calculating the other parameter by using a definition of a LID budget, wherein the LID budget is in a predetermined range, the LID budget is defined as
  LID budget=$\int_{t1}^{t'}\int_{400}^{1100} I(\lambda)T(t')d\lambda dt'$, where I denotes the irradiance, $\lambda$ denotes a wavelength of the irradiance, T denotes the temperature and t' denotes the time;
  (c) irradiating the solar cell with the irradiance;
  (d) maintaining the solar cell at the temperature; and
  (e) removing the solar cell away from the irradiance of step cc) after the time.

7. The method of claim 6, wherein the temperature of the solar cell is maintained by being irradiated in step (c).

8. The method of claim 6, wherein the temperature of the solar cell is maintained by an external heating means.

9. The method of claim 6, wherein the temperature of the solar cell decreases to the room temperature after step (e).

10. The method of claim 6, wherein the LID budget is within $4.0\times10^3$ and $3.5\times10^4$ kW° C. sec/m$^2$.

11. The method of claim 6, wherein the LID budget is within $7.0\times10^3$ and $3.5\times10^4$ kW° C. sec/m$^2$.

12. The method of claim 6, wherein the irradiance is generated by two light sources.

13. The method of claim 12, wherein the irradiance is an average irradiance of the light sources.

14. A process of manufacturing a solar cell, the process comprising the steps of:
  (a) texturing a silicon substrate of the solar cell;
  (b) forming a p-n junction of the solar cell;
  (c) forming a conductive layer of the solar cell;
  (d) setting three parameters including an irradiance, a temperature and a time by using a definition of a light-induced-degradation (LID) budget,
    wherein the LID budget is defined as
    LID budget=$\int_{t1}^{t'}\int_{400}^{1100} I(\lambda)T(t')d\lambda dt'$, where I denotes the irradiance, $\lambda$ denotes a wavelength of the irradiance, T denotes the temperature and t' denotes the time;
  (e) irradiating the solar cell with the irradiance;
  (f) maintaining the solar cell at the temperature; and
  (g) removing the solar cell away from the irradiance of step (e) after the time.

15. The process of claim 14, wherein the LID budget is within $4.0\times10^3$ and $3.5\times10^4$ kW ° C. sec/m$^2$.

16. The process of claim 14, wherein the LID budget is within $7.0\times10^3$ and $3.5\times10^4$ kW ° C. sec/m$^2$.

* * * * *